(12) United States Patent
Ma et al.

(10) Patent No.: US 6,560,139 B2
(45) Date of Patent: May 6, 2003

(54) LOW LEAKAGE CURRENT SRAM ARRAY

(75) Inventors: Lin Ma, Beaverton, OR (US);
Wenliang Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/800,015

(22) Filed: Mar. 5, 2001

(65) Prior Publication Data

US 2002/0122329 A1 Sep. 5, 2002

(51) Int. Cl.[7] .............................................. G11C 11/00
(52) U.S. Cl. ........................ 365/154; 365/156; 365/190
(58) Field of Search ................. 365/154, 156, 365/190, 129

(56) References Cited

U.S. PATENT DOCUMENTS

| | | | | | |
|---|---|---|---|---|---|
| 4,764,897 A | * | 8/1988 | Kameyama et al. | ........ | 327/208 |
| 5,257,236 A | * | 10/1993 | Sharp | ..................... | 365/189.04 |
| 5,581,500 A | * | 12/1996 | D'Souza | ..................... | 365/149 |
| 5,610,870 A | * | 3/1997 | Choi | ........................... | 365/149 |
| 5,621,693 A | * | 4/1997 | Nakase | ........................ | 365/156 |
| 5,986,923 A | * | 11/1999 | Zhang et al. | ............... | 365/154 |
| 6,172,901 B1 | * | 1/2001 | Portacci | ...................... | 365/154 |

* cited by examiner

*Primary Examiner*—Hoai Ho
(74) *Attorney, Agent, or Firm*—Blakely, Sokoloff, Taylor & Zafman LLP

(57) ABSTRACT

An SRAM array is disclosed. The SRAM array includes a plurality of SRAM cells. In one embodiment, the SRAM cells are 6-T SRAM cells that further includes a voltage bias device. The voltage bias device raises the voltage level of a low voltage rail $V_{ss}$ such that the plurality of SRAM cells are connected to a raised low voltage rail.

20 Claims, 3 Drawing Sheets

LOW LEAKAGE CURRENT SRAM ARRAY

TECHNICAL FIELD OF THE INVENTION

The present invention relates to integrated circuits, and more particularly, to a SRAM array having reduced bitline leakage current.

BACKGROUND OF THE INVENTION

Metal oxide semiconductor (MOS) static random access memory (SRAM) arrays are comprised of an array of SRAM cells. The SRAM cells are read, erased, and written to by means of bitlines (BL) and wordlines (WL). In one common design, the SRAM cells consist of load elements in a flip-flop configuration, together with two select transistors.

FIG. 1 is a schematic circuit diagram of a six-transistor (6T) SRAM cell 101 that is commonly and widely used in SRAM memory arrays. The SRAM cell 101 is known in the art as a 6T SRAM cell. The SRAM cell 101 includes N-type MOS (NMOS) transistors N1 and N2 (hereinafter transistors N1 and N2) coupled between $V_{SS}$ (typically ground) and nodes A and B, respectively. Nodes A and B are further coupled to $V_{DD}$ by pull-up P-type MOS (PMOS) transistors P1 and P2 (hereinafter transistors P1 and P2), respectively. Node A is further coupled to the gates of transistors P2 and N2 and node B is similarly coupled to the gates of transistors P1 and N1.

Information is stored in SRAM cell 101 in the form of voltage levels in the flip-flop formed by the two cross-coupled inverters formed by transistors P1, N1 and P2, N2, respectively. In particular, when node A is at a logic low state (the voltage of node A being approximately equal to $V_{SS}$), transistor P2 is on (in a low resistance state or conducting) and transistor N2 is off (in a high resistance state or non conducting). When transistor P2 is on and transistor N2 is off, node B is at a logic high state (the voltage of node B is pulled up to approximately $V_{DD}$). Further, when node B is at a logic high state, transistor P1 is off and transistor N1 is on. When transistor P1 is off and transistor N1 is on, node A is at a logic low state (the voltage of node A is pulled down to approximately $V_{SS}$). In this manner, SRAM cell 101 remains in a latched state.

Nodes A and B are further coupled to a "bitline" and a "bitline-not" by NMOS select transistors N3 and N4 (hereinafter transistors N3 and N4), respectively. The gates of transistors N3 and N4 are coupled to a word line to enable read and write operations, as those skilled in the art will understand.

A read operation is performed by turning on the word line and allowing one side of the SRAM cell to start pulling down on one line of the bitline pair. For example, if node A is low and the word line is pulled high, then a current will flow through select transistor N3 and transistor N1 to ground or $V_{ss}$.

When node A is low and the word line is low, the SRAM cell 101 has a leakage current 103 that flows from the bitline through the select transistor N3 and transistor N1 down to ground or $V_{ss}$.

As the size of the SRAM cells decreases, the amount of read current produced by the SRAM cell also decreases, particularly as the supply voltage $V_{cc}$ is lowered as technology advances. As the amount of read current decreases, the leakage current becomes larger relative to the read current, thereby making it more difficult to accurately read the SRAM cell. Thus, it is desirable to lower the amount of leakage current from each SRAM cell.

One method of solving this problem is to reduce the number of SRAM cells per bitline, thereby reducing the overall amount of leakage current. However, this increases the amount of overhead devices such as sense amplifiers, column multiplexer circuitry, etc. for a given number of SRAM cells.

Another approach is to increase the channel length of the transistors in the SRAM cell. However, this increases the SRAM cell size. Furthermore, effect of this approach is limited, as the transistor devices get smaller.

BRIEF DESCRIPTION OF THE DRAWINGS

The present invention is illustrated by way of example and not limitation in the accompanying Figures.

DETAILED DESCRIPTION

Methods and apparatus' for a SRAM memory array having reduced leakage current are disclosed. The subject of the invention will be described with reference to numerous details set forth below, and the accompanying drawings will illustrate the invention. The following description of the drawings are illustrative of the invention and are not to be construed as limiting the invention. Numerous specific details are described to derive a thorough understanding of present invention. However, in certain circumstances, well known, or conventional details are not described in order not to obscure the present invention in detail.

In general, the amount of leakage current through a channel of a transistor follows an exponential relationship with the gate to source voltage difference ($V_{gs}$), in the sub threshold region of transistor behavior. Empirically, it has been determined to increase about 10 times per 100 millivolt increase in $V_{gs}$ in the sub threshold region. Moreover, it has an approximately linear relationship with $V_{cc}$, the supply voltage.

Figure 1:
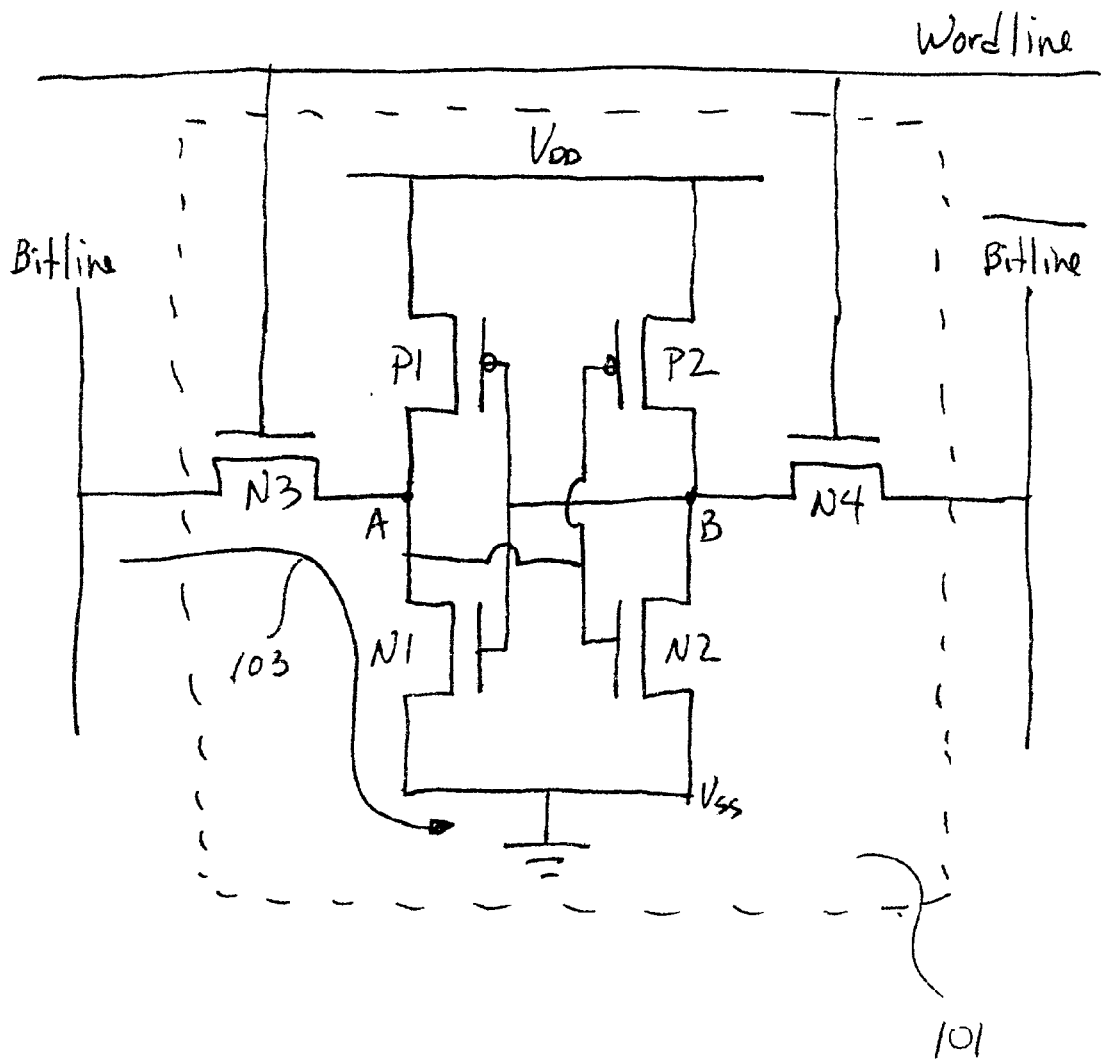
FIG. 1 is a schematic diagram of a prior art SRAM cell.

The magnitude of the read current of an SRAM cell 101, shown in FIG. 1, is essentially the saturation current of the pull-down transistors N3 and N4. This is proportional to the square of the difference between $V_{cc}$ and $V_t$, the threshold voltage of the pull-down transistors. Therefore, with respect to $V_{cc}$, the read current declines faster than the leakage current as the supply voltage ($V_{cc}$) is lowered.

Figure 2:
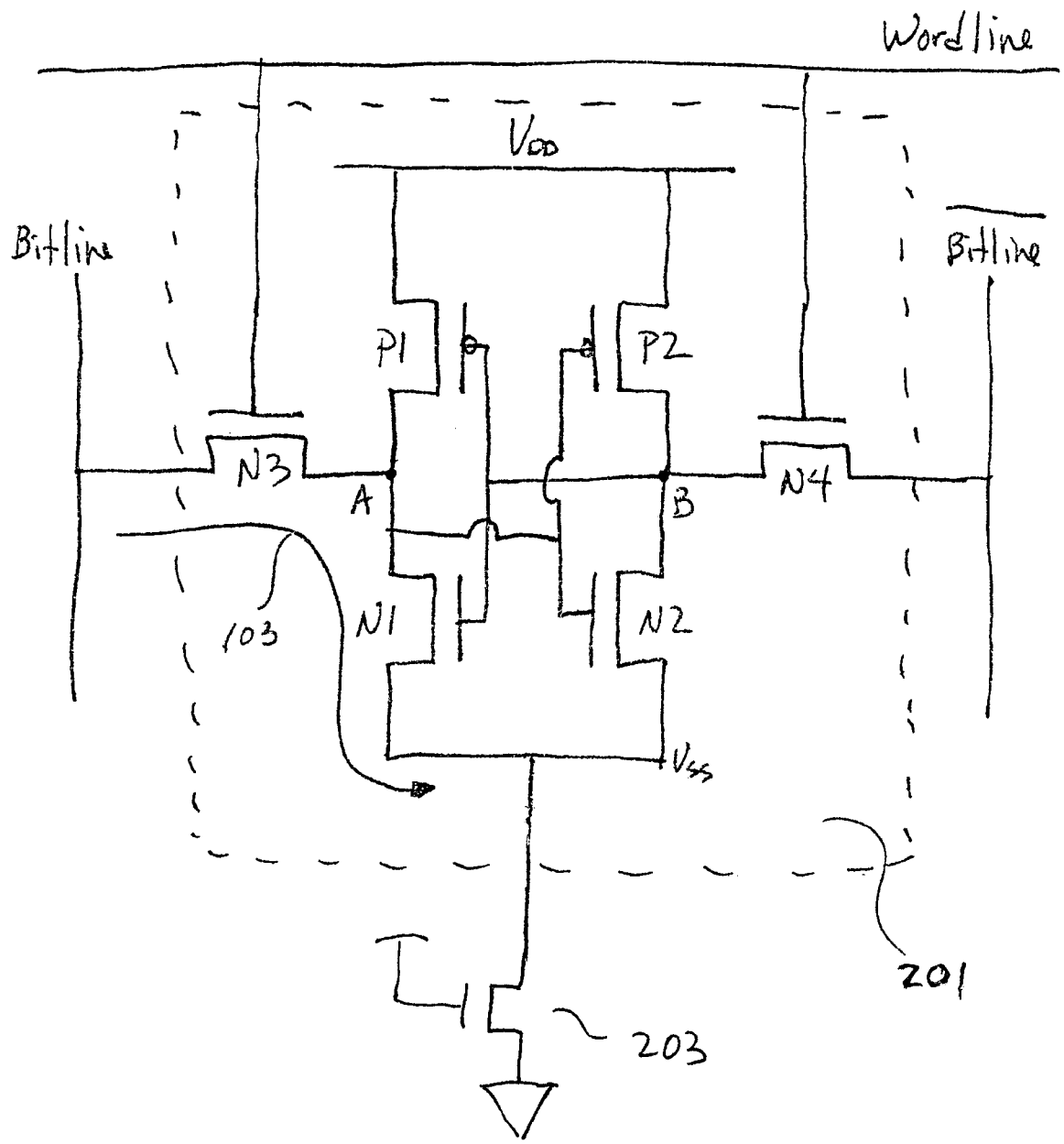
FIG. 2 is a schematic diagram of an SRAM cell incorporating the present invention.

With these principles in mind, FIG. 2 shows an SRAM cell 201 formed in accordance with the present invention. In many respects, the SRAM cell 201 is substantially similar to the SRAM cell 101 of FIG. 1. However, as seen in FIG. 2, the sources of the pull-down transistors N1 and N2 are not connected directly to $V_{ss}$ (ground). Instead, the sources of the pull-down transistors N1 and N2 are connected to $V_{ss}$ (ground) through a bias device 203. The bias device 203 can be a transistor that produces a small positive voltage on its' source node, equivalent to the voltage drop across the channel of the bias transistor 203. Typically, this voltage drop is on the order of 0.1 volts. Consequently, the pull-down transistors N1 and N2 transfer the positive biasing voltage to the source nodes of the access transistors N3 and N4.

By raising the voltage on the sources of the NMOS transistors N1 and N2 in the SRAM 201 slightly above $V_{cc}$, the voltage between gate to source ($V_{gs}$) of transistors N1 and N2 is now negative. The threshold voltage $V_t$ is raised as the reverse-biased source junction depletes part of the channel. These effects combine to reduce leakage current exponentially, while reducing the read current only slightly.

Further, although a biasing transistor 203 is used to raise the level of the source nodes of the transistors N1 and N2, any device that can raise the voltage on the source nodes of transistors N1 and N2 above $V_{ss}$ may be used. As one example, a controllable voltage source, or a simple resistor, may be used. In one embodiment, the amount of bias voltage used to raise $V_{ss}$ is on the order of 0.1 volts. However, higher or lower bias voltages may be implemented to accommodate design variations. For example, by reducing the size of transistors 203, a higher bias voltage may be applied to the sources of the transistors N1 and N2. This approach further decreases the leakage current, however at the expense of a lower read current signal. As another example, by a "larger" bias transistor having a low voltage drop across its' channel may be used to apply a lower bias voltage to the sources of the transistors N1 and N2. This approach results in a lower decrease in the leakage current, however with the benefit of a higher read current signal. Thus, the present invention may be modified to fit the requirements of a particular integrated circuit.

Moreover, although only a single SRAM cell 201 is shown in FIG. 2, the biasing transistor 203 is connected to all of the pull-down transistors N1 and N2 of all of the SRAM cells 201 in a single column in the SRAM memory array. Thus, only a single bias transistor 203 is required for each column of the memory array. Further, in one embodiment, the bias transistor 203 is always in the "on" state by biasing the gate of the bias transistor 203 to the supply voltage $V_{cc}$.

As noted above, the use of the bias transistor 203, while decreasing the leakage current, also has the undesirable effect of lowering the read current. Thus, turning to FIG. 3, in an alternative embodiment, a two level bias transistor scheme may be used. In particular, the bias transistor may comprise a small bias transistor 301 and a large bias transistor 303.

Figure 3:
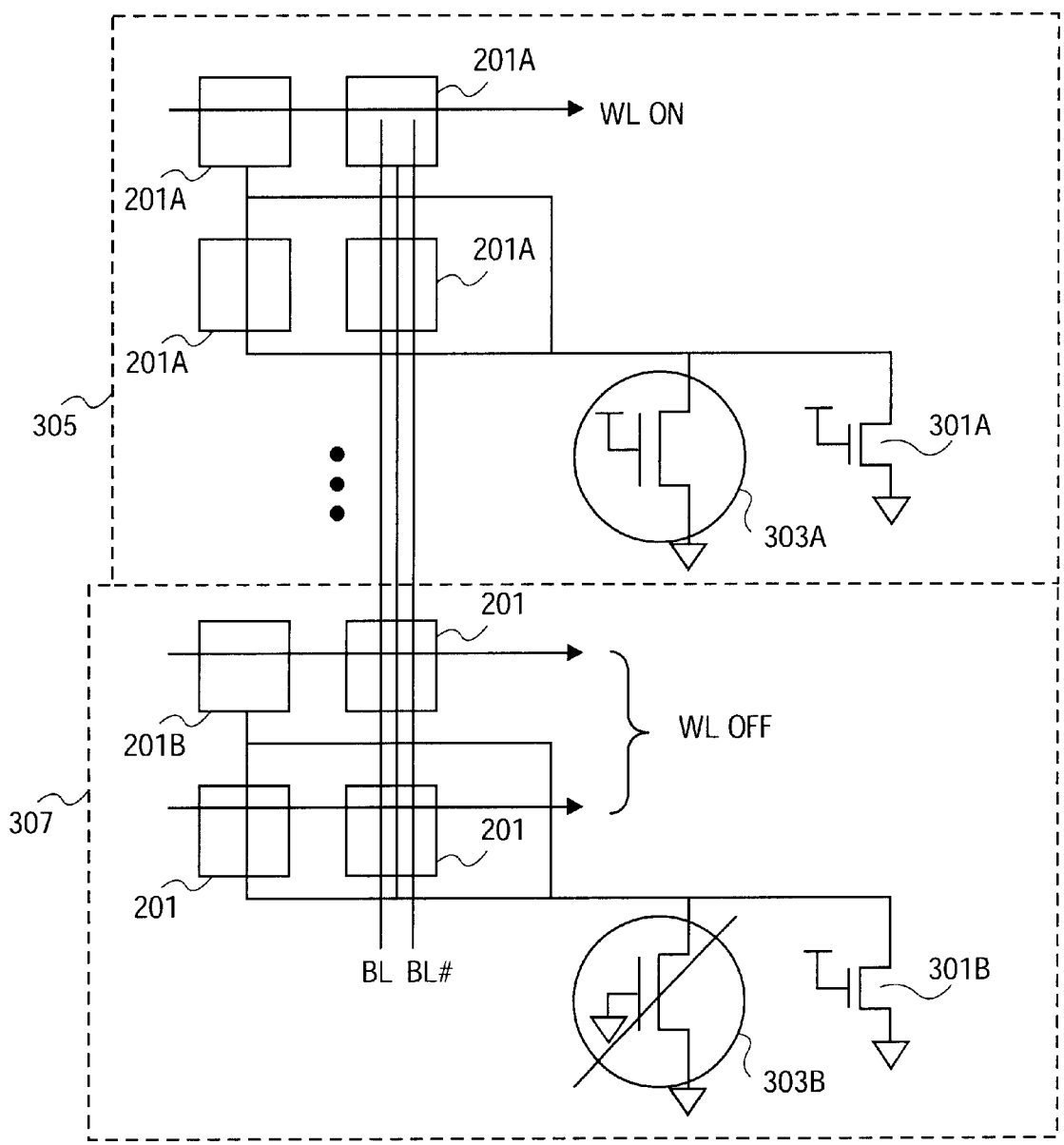
FIG. 3 is a schematic diagram of an SRAM array incorporating an alternative embodiment of the present invention.

FIG. 3 shows two portions of an SRAM array. The first portion 305 is being accessed, while the second portion 307 is not being accessed. In the second portion of 307 of the SRAM array that is not being accessed (read), only the small bias transistor 301b is turned "on" to maintain a relatively high raised $V_{ss}$ level. This has the effect of significantly reducing leakage current.

In the first portion 305 of the SRAM array that is being accessed (read), both the small bias transistor 301a and the large bias transistor 303a are turned on. By turning on the large bias transistor 303a, this will tend to bring the source node of the transistors of the SRAM cells 201a closer to ground ($V_{ss}$). This has the effect of reducing leakage current while maintaining good read current.

Thus, the selective scheme of FIG. 3 is beneficial at low $V_{cc}$ supply voltage conditions where the read current is small. The precise block size should be determined by trade offs between acceptable read current/leakage current ratios and cost and increased area required by the two biasing transistors for each portion of the SRAM array. For blocks of the memory array that are "on," both the small biasing transistor 301 and the large biasing transistor 303 are turned "on." This results in the virtual "$V_{ss}$" node near ground and allows the memory array to sink read current.

By lowering the leakage current, the present invention allows a higher number of SRAM cells per bitline, thereby reducing the amount of overhead for an array of given size. Further, the present invention requires relatively little overhead, using only a few transistor devices for a large number of SRAM cells and little additional routing overhead. Finally, the present invention can maintain channel leakage current small relative to read current even at low supply voltages.

While specific embodiments of applications of the present invention have been illustrated and described, it is to be understood that the invention is not limited to the precise configuration and components disclosed herein. Various modifications, changes, and variations, which will be apparent to those skilled in the art, may be made in the arrangement, operation, in details of the methods and systems of the present invention disclosed herein without departing from the spirit and scope of the invention.

These modifications can be made to the invention in light of the above detailed description. The terms used in the following claims should not be used to limit the invention to the specific embodiments disclosed in the specification and the claims. Rather, the scope of the invention is to be determined entirely by the following claims, which are to be construed in accordance with established canons of claim interpretation.

What is claimed is:

1. An SRAM array comprising:
   a plurality of SRAM cells, each of said SRAM cells adapted for connection to a wordline, a power supply $V_{dd}$, a bitline, a bitline-not, and a low voltage rail $V_{ss}$; and
   a bias device coupled to said plurality of SRAM cells to raise a voltage level of a raised low voltage rail that is connected to said plurality of SRAM cells such that the voltage level of the raised low voltage rail is maintained above $V_{ss}$ during read and storage operations.

2. The array of claim 1 wherein said bias device is a bias transistor between said low voltage rail $V_{ss}$ and said raised low voltage rail.

3. The array of claim 1 wherein said bias device is a resistor.

4. The array of claim 1 wherein said plurality of SRAM cells are 6T SRAM cells.

5. The array of claim 1 wherein said raised low voltage rail is about 0.1 volts higher than said low voltage rail $V_{ss}$.

6. A SRAM memory column, comprising:
   a set of memory cells each having a first select transistor connected between a bitline and a first node, a gate of said first select transistor connected to a wordline, a second select transistor connected between a bitline-not and a second node, a gate of said second select transistor connected to said wordline, a first load transistor connected between said first node and a power supply rail, a second load transistor connected between said second node and said power supply rail; and
   a voltage bias device connected to a low voltage rail $V_{ss}$, the first select transistor being coupled through said first node to said voltage bias device, and the second transistor being coupled through said second node to said voltage bias device, the voltage bias device to maintain a voltage level above $V_{ss}$ on a high-voltage side of the voltage bias device during read and storage operations.

7. The column of claim 6 wherein said voltage bias device is a transistor between said low voltage rail $V_{ss}$ and said first select transistor and second select transistor.

8. The column of claim 6 wherein said voltage bias device is a voltage source between said low voltage rail $V_{ss}$ and said first select transistor and second select transistor.

9. The column of claim 6 wherein said voltage bias device raises said low voltage rail $V_{ss}$ by about 0.1 volts on its high-voltage side.

10. The column of claim 6 wherein said voltage bias device is a resistor between said low voltage rail $V_{ss}$ and said first select transistor and second select transistor.

11. A SRAM column comprising:
 a plurality of 6-T SRAM cells each having a power supply rail node to receive a power supply voltage from a power supply rail $V_{dd}$ and a raised low voltage rail node; and
 a voltage bias device coupled between a low voltage rail $V_{SS}$ and said raised low voltage rail node to maintain a voltage level of the raised low voltage rail above the low voltage rail $V_{SS}$ during read and storage operations.

12. The column of claim 11 wherein said voltage bias device is a bias transistor between said low voltage rail $V_{ss}$ and said raised low voltage rail node.

13. The column of claim 11 wherein said voltage bias device has a voltage level that is greater than that of said low voltage rail $V_{ss}$ by about 0.1 volts.

14. The column of claim 11 wherein said voltage bias device is a resistor between said low voltage rail $V_{ss}$ and said raised low voltage node.

15. A method of reducing bitline leakage current in a SRAM cell of a column of SRAM cells, the method comprising:
 biasing a voltage of a node of said SRAM cell by a voltage amount that is different than that of both a supply rail and a low voltage rail using a voltage bias device coupled to the column of SRAM cells;
 connecting at least one of said column of SRAM cells to a bitline, and a wordline; and
 maintaining the voltage of the node of said SRAM cell such that it is different than that of the supply and low voltage rails during read and storage operations for said at least one SRAM cell.

16. The method of claim 15 wherein said voltage amount is about 0.1 volts.

17. The method of claim 15, wherein the bias device comprises a transistor.

18. An SRAM array comprising:
 a plurality of SRAM cells, each of said SRAM cells adapted for connection to a wordline, a power supply $V_{dd}$, a bitline, a bitline-not, and a low voltage rail $V_{ss}$; and
 first and second bias devices comprising small and large bias transistors, respectively, coupled to said plurality of SRAM cells to raise voltage level of a raised low voltage rail that is connected to said plurality of SRAM cells, wherein said small bias transistor and said large bias transistor are turned on when the plurality of SRAM cells are not being accessed..

19. The SRAM array of claim 18, wherein said large bias transistor is turned on when said plurality of SRAM cells are being read.

20. The SRAM array of claim 18, wherein said large bias transistor is turned off when said plurality of SRAM cells are not being read.

* * * * *